(12) United States Patent
Tang et al.

(10) Patent No.: US 11,778,925 B2
(45) Date of Patent: Oct. 3, 2023

(54) MAGNETIC DEVICE

(71) Applicant: TDK CORPORATION, Tokyo (JP)

(72) Inventors: Zhenyao Tang, Tokyo (JP); Yohei Shiokawa, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/171,623

(22) Filed: Feb. 9, 2021

(65) Prior Publication Data

US 2022/0254992 A1 Aug. 11, 2022

(51) Int. Cl.
| | |
|---|---|
| *H10N 52/80* | (2023.01) |
| *H10B 61/00* | (2023.01) |
| *H10N 52/00* | (2023.01) |
| *H10N 50/85* | (2023.01) |
| *H10N 52/01* | (2023.01) |

(52) U.S. Cl.
CPC ............. *H10N 52/80* (2023.02); *H10B 61/22* (2023.02); *H10N 50/85* (2023.02); *H10N 52/00* (2023.02); *H10N 52/01* (2023.02)

(58) Field of Classification Search
CPC ....... H01L 43/04; H01L 27/228; H01L 43/06; H10N 52/80; H10N 52/00; H10B 61/00; H10B 61/22

See application file for complete search history.

(56) References Cited

U.S. PATENT DOCUMENTS

| | | |
|---|---|---|
| 8,836,000 B1 | 9/2014 | Lin |
| 9,184,375 B1 | 11/2015 | Tang et al. |
| 10,354,681 B1 * | 7/2019 | Chien ................... G11B 5/3912 |
| 2005/0157431 A1 * | 7/2005 | Hatatani ................. B82Y 25/00 360/319 |
| 2008/0304353 A1 | 12/2008 | Abraham et al. |
| 2010/0053821 A1 * | 3/2010 | Watanabe ................ G11B 5/40 360/319 |
| 2011/0089511 A1 | 4/2011 | Keshtbod et al. |
| 2011/0260272 A1 | 10/2011 | Lee et al. |
| 2013/0249024 A1 * | 9/2013 | Saida ..................... H01L 27/228 257/E43.002 |
| 2015/0171315 A1 | 6/2015 | Gan et al. |
| 2016/0233417 A1 | 8/2016 | Lee et al. |
| 2019/0279907 A1 * | 9/2019 | Tang ..................... G01R 33/093 |
| 2020/0106004 A1 * | 4/2020 | Komura ................. G11C 11/161 |
| 2020/0194311 A1 | 6/2020 | Tang et al. |
| 2021/0249590 A1 * | 8/2021 | Komura ................... H01L 43/08 |

FOREIGN PATENT DOCUMENTS

| | | | |
|---|---|---|---|
| JP | 2017-216286 A | | 12/2017 |
| JP | 2020035792 A | * | 3/2020 |

OTHER PUBLICATIONS

English translation JP-2020035792-A (Year: 2020).*

* cited by examiner

*Primary Examiner* — Latanya N Crawford Eason
(74) *Attorney, Agent, or Firm* — Oliff PLC

(57) ABSTRACT

A magnetic device includes a stacked body including a first ferromagnetic layer, a second ferromagnetic layer, and a non-magnetic layer sandwiched between the first ferromagnetic layer and the second ferromagnetic layer; a first insulating layer which covers side surfaces of the stacked body; and a radiator located outside the first insulating layer with respect to the stacked body, in which a distance between the stacked body and the radiator differs depending on a position of the stacked body in a stacking direction.

16 Claims, 10 Drawing Sheets

MAGNETIC DEVICE

BACKGROUND OF THE INVENTION

Field of the Invention

The present invention relates to a magnetic device.

Description of Related Art

Giant magnetoresistance (GMR) elements consisting of a multilayer film of a ferromagnetic layer and a non-magnetic layer, and tunnel magnetoresistance (TMR) elements using an insulating layer (a tunnel barrier layer, a barrier layer) as the non-magnetic layer are known as magnetoresistance effect elements. The magnetoresistance effect elements can be applied to a magnetic sensor, a radio frequency component, a magnetic head, and a non-volatile random access memory (MRAM).

The MRAM is a storage element in which a magnetoresistance effect element is integrated. The MRAM reads and writes data, by utilizing characteristics in which the resistance of the magnetoresistance effect element changes when mutual directions of magnetization of the two ferromagnetic layers sandwiching the non-magnetic layer in the magnetoresistance effect element change.

For example, Japanese Unexamined Patent Application, First Publication No. 2017-216286 describes a magnetoresistance effect element that performs writing by the use of a spin-orbit torque (SOT).

SUMMARY OF THE INVENTION

The magnetoresistance effect element may generate heat when writing data. The heat generated by the magnetoresistance effect element can cause an adverse effect on the control element, other magnetoresistance effect elements, and the like.

The present invention has been made in view of the above circumstances, and an object of the present invention is to provide a magnetic device capable of efficiently radiating heat generated by the magnetoresistance effect element.

The present invention provides the following means for solving the aforementioned problems.

(1) A magnetic device according to a first aspect includes a stacked body including a first ferromagnetic layer, a second ferromagnetic layer, and a non-magnetic layer sandwiched between the first ferromagnetic layer and the second ferromagnetic layer; a first insulating layer which covers side surfaces of the stacked body; and a radiator located outside the first insulating layer with respect to the stacked body, in which a distance between the side surfaces of the stacked body and the radiator differs depending on a position of the stacked body in a stacking direction.

(2) In the magnetic device according to the aforementioned aspect, the radiator may be inclined with respect to the stacking direction.

(3) In the magnetic device according to the aforementioned aspect, the side surfaces of the stacked body may be inclined with respect to the stacking direction, and an inclination direction of the side surfaces of the stacked body with respect to the stacking direction may be the same as the inclination direction of the radiator with respect to the stacking direction.

(4) The magnetic device according to the aforementioned aspect may further include a wiring connected to the stacked body and extending in a first direction, in which a plurality of radiators may be provided, each of the plurality of the radiators may extend along the first direction, and the stacked body may be sandwiched between the two radiators.

(5) In the magnetic device according to the aforementioned aspect, the radiator may surround the side surfaces of the stacked body.

(6) In the magnetic device according to the aforementioned aspect, the radiator may include fine particles having an average particle size of 10 nm or less.

(7) In the magnetic device according to the aforementioned aspect, the radiator may include a metal.

(8) In the magnetic device according to the aforementioned aspect, the metal may be any one of copper, cobalt, tungsten, tantalum, ruthenium, and aluminum.

(9) In the magnetic device according to the aforementioned aspect, the radiator may be a non-magnetic material.

(10) In the magnetic device according to the aforementioned aspect, the radiator may be in contact with part of the stacked body.

(11) The magnetic device according to the aforementioned aspect may further include a wiring connected to the stacked body and extending in the first direction, in which the radiator may be in contact with the wiring.

(12) In the magnetic device according to the aforementioned aspect, a height of the radiator in the stacking direction may be higher than a height of the stacked body.

(13) In the magnetic device according to the aforementioned aspect, a plurality of the radiators may be provided toward outside with respect to the stacked body.

(14) In the magnetic device according to the aforementioned aspect, a space may be provided outside the radiator with respect to the stacked body.

DETAILED DESCRIPTION OF THE INVENTION

Figure 1:
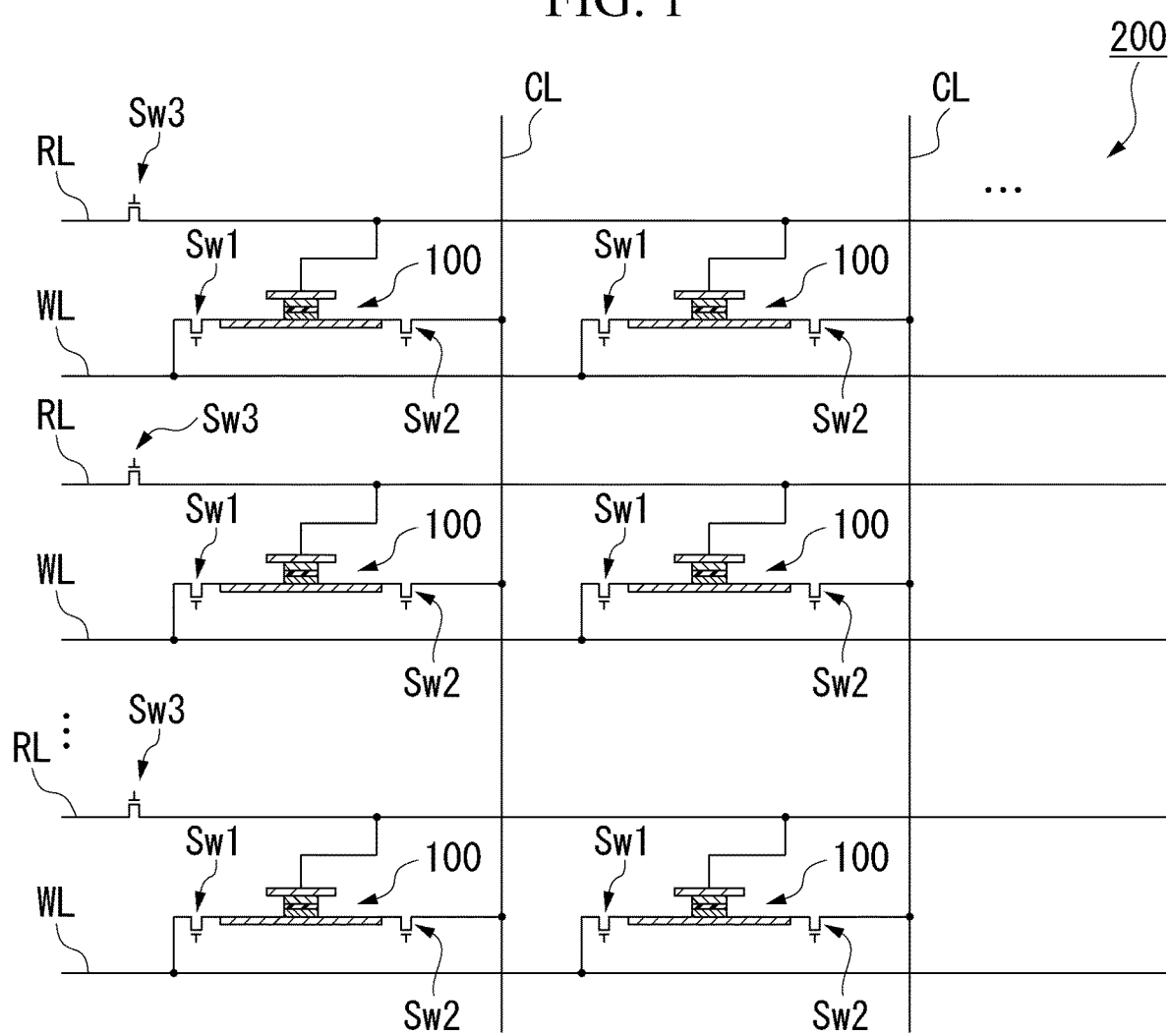
FIG. 1 is a schematic view of a magnetic device according to a first embodiment.

Hereinafter, the present embodiment will be described in detail while referring the drawings as appropriate. In the drawings used in the following description, in some cases, the featured portion may be enlarged for convenience to make the feature easy to understand, and a dimensional ratio or the like of each component may be different from the actual one. Materials, dimensions, and the like exemplified in the following description are examples, the present invention is not limited thereto, and can be appropriately modified and carried out within the range in which the effects of the present invention are exhibited.

First, the direction will be defined. One direction of one surface of a substrate Sub (see FIG. 2) to be described later is defined as an x direction, and a direction orthogonal to the x direction is defined as a y direction. The x direction is, for example, a direction from an electrode 31 toward an electrode 32. A z direction is a direction orthogonal to the x direction and the y direction. The z direction is an example of a stacking direction. The direction from the substrate Sub toward a magnetoresistance effect element 100 is defined as a +z direction. Hereinafter, in some cases, the +z direction may be expressed as "top" and a −z direction may be expressed as "bottom". The top and bottom do not always coincide with the direction in which gravity is applied.

In the present specification, "extending in the x direction" means, for example, that a dimension in the x direction is larger than a minimum dimension among dimensions in the x direction, the y direction, and the z direction. The same also applies to a case of extending in the other direction.

First Embodiment

FIG. 1 is a configuration diagram of a magnetic device 200 according to the first embodiment. The magnetic device 200 is equipped with a plurality of magnetoresistance effect elements 100, a plurality of writing lines WL, a plurality of common lines CL, a plurality of reading lines RL, a plurality of first switching elements Sw1, a plurality of second switching elements Sw2, and a plurality of third switching elements Sw3. The magnetic device 200 can be used for a spin memoristor, a magnetic memory, an IoT device, a neuromorphic device, and the like.

The magnetoresistance effect element 100 is arranged, for example, in a matrix. Each of the magnetoresistance effect elements 100 is connected to each of the writing line WL, the reading line RL, and the common line CL.

The writing line WL electrically connects a power supply and one or more magnetoresistance effect elements 100. The common line CL is a wiring used both when writing data and when reading data. The common line CL electrically connects a reference potential and one or more magnetoresistance effect elements 100. The reference potential is, for example, ground. The common line CL may be provided in each of the plurality of magnetoresistance effect elements 100, or may be provided over the plurality of magnetoresistance effect elements 100. The reading line RL electrically connects the power supply and one or more magnetoresistance effect elements 100. The power supply is connected to the magnetic device 200 during use.

Each magnetoresistance effect element 100 is connected to each of the first switching element Sw1, the second switching element Sw2, and the third switching element Sw3. The first switching element Sw1 is connected between the magnetoresistance effect element 100 and the writing line WL. The second switching element Sw2 is connected between the magnetoresistance effect element 100 and the common line CL. The third switching element Sw3 is connected to a reading line RL extending over the plurality of magnetoresistance effect elements 100.

When the first switching element Sw1 and the second switching element Sw2 are turned on, a writing current flows between the writing line WL and the common line CL connected to the predetermined magnetoresistance effect element 100. When the writing current flows through the magnetoresistance effect element 100, data is recorded in the magnetoresistance effect element 100. When the second switching element Sw2 and the third switching element Sw3 are turned on, a reading current flows between the common line CL and the reading line RL connected to the predetermined magnetoresistance effect element 100. When a reading current flows through the magnetoresistance effect element 100, data is read from the magnetoresistance effect element 100.

The first switching element Sw1, the second switching element Sw2, and the third switching element Sw3 are elements that control the flow of current. The first switching element Sw1, the second switching element Sw2, and the third switching element Sw3 are, for example, a transistor, an element such as an ovonic threshold switch (OTS) that utilizes a phase change of a crystal layer, an element such as a metal insulator transition (MIT) switch that utilizes a change in band structure, an element such as a Zener diode and an avalanche diode that utilizes a breakdown voltage, and an element whose conductivity changes with a change in atomic position.

In the magnetic device 200 shown in FIG. 1, the magnetoresistance effect element 100 connected to the same wiring shares the third switching element Sw3. The third switching element Sw3 may be provided in each magnetoresistance effect element 100. Further, the third switching element Sw3 may be provided in each magnetoresistance effect element 100, and the first switching element Sw1 or the second switching element Sw2 may be shared by the magnetoresistance effect element 100 connected to the same wiring.

Figure 2:
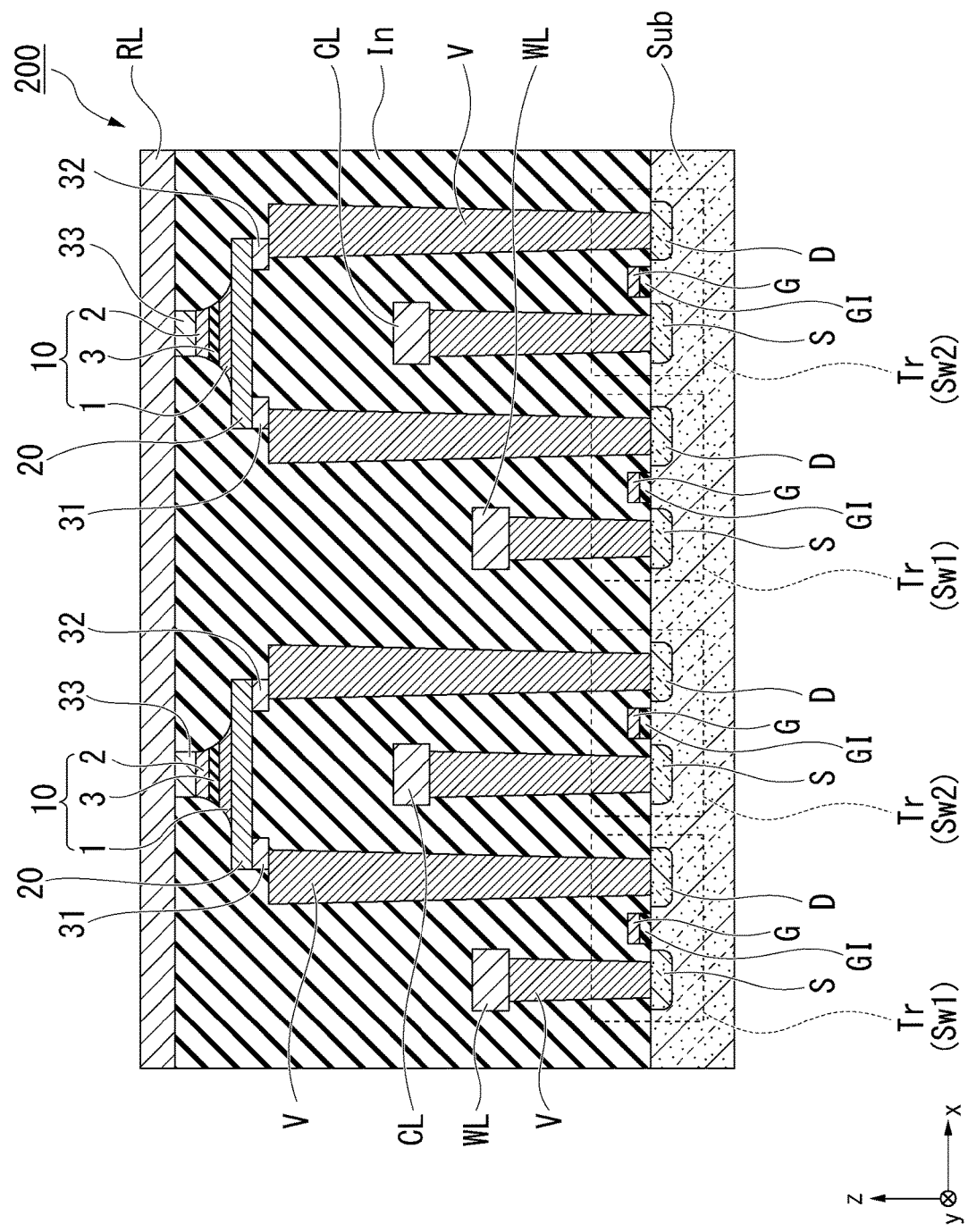
FIG. 2 is a cross-sectional view of the magnetic device according to the first embodiment.

FIG. 2 is a cross-sectional view of the magnetic device 200 according to the first embodiment. FIG. 2 is a cross section of the magnetic device 200 taken along a xz plane passing through a center of a width of a spin-orbit torque wiring 20 to be described below in the y direction.

The first switching element Sw1 and the second switching element Sw2 shown in FIG. 2 are transistors Tr. The third switching element Sw3 is connected to the reading line RL, and is located, for example, at a different position in the x direction of FIG. 2. The transistor Tr is, for example, a field effect transistor, and has a gate electrode G, a gate insulating film GI, a source S formed on the substrate Sub, and a drain D on the substrate Sub. A positional relationship between the source S and the drain D is an example, and may be opposite to each other. The substrate Sub is, for example, a semiconductor substrate.

The transistor Tr and the magnetoresistance effect element 100 are electrically connected to each other via a via wiring V and electrodes 31 and 32. Further, the transistor Tr and the writing line WL or the common line CL are connected to each other by a via wiring V. Further, the reading line RL and the magnetoresistance effect element 100 are electrically connected to each other via an electrode 33. The via wiring V and the electrodes 31, 32 and 33 include a conductive material.

The periphery of the magnetoresistance effect element 100 and the transistor Tr is covered with an insulator In. The insulator In is an insulating layer that insulates between the wirings of the multilayer wiring and between the elements. The insulator In is, for example, silicon oxide ($SiO_x$), silicon nitride ($SiN_x$), silicon carbide (SiC), chromium nitride, silicon carbide (SiCN), silicon oxynitride (SiON), aluminum oxide ($Al_2O_3$), zirconium oxide ($ZrO_x$) and the like.

Figure 3:
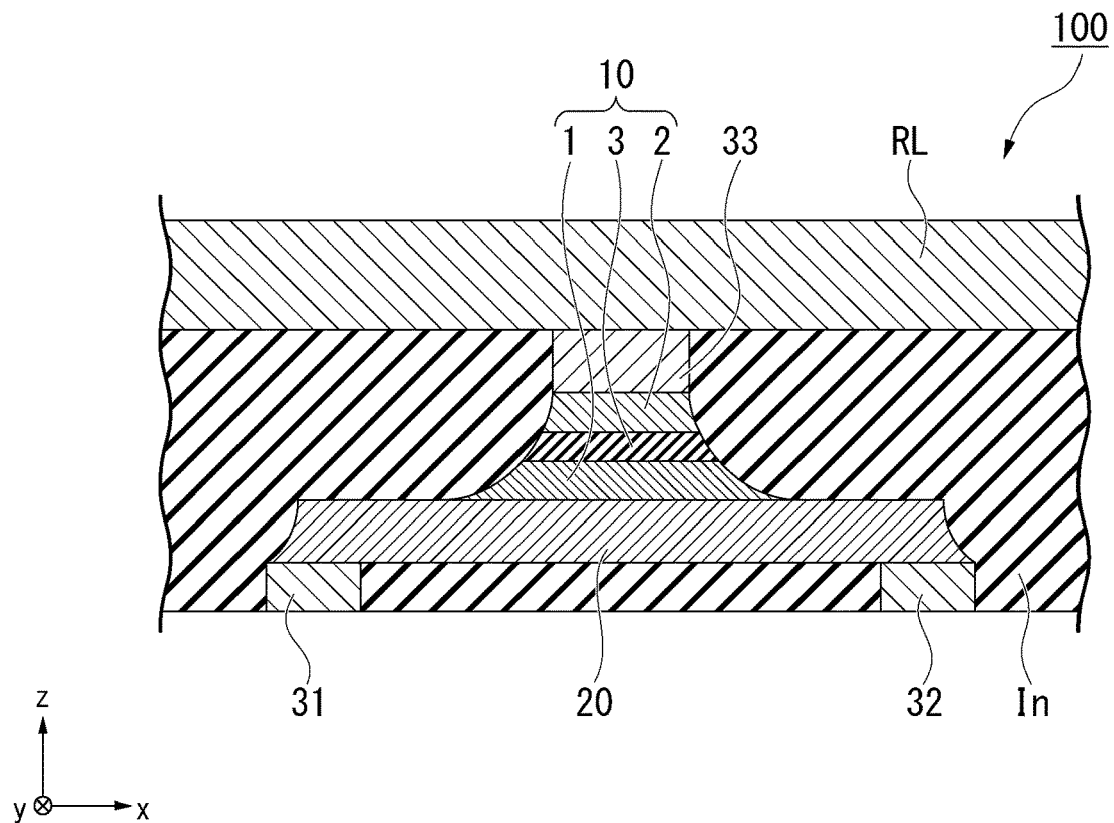
FIG. 3 is an enlarged cross-sectional view of the vicinity of a magnetoresistance effect element of the magnetic device according to the first embodiment.
Figure 4:
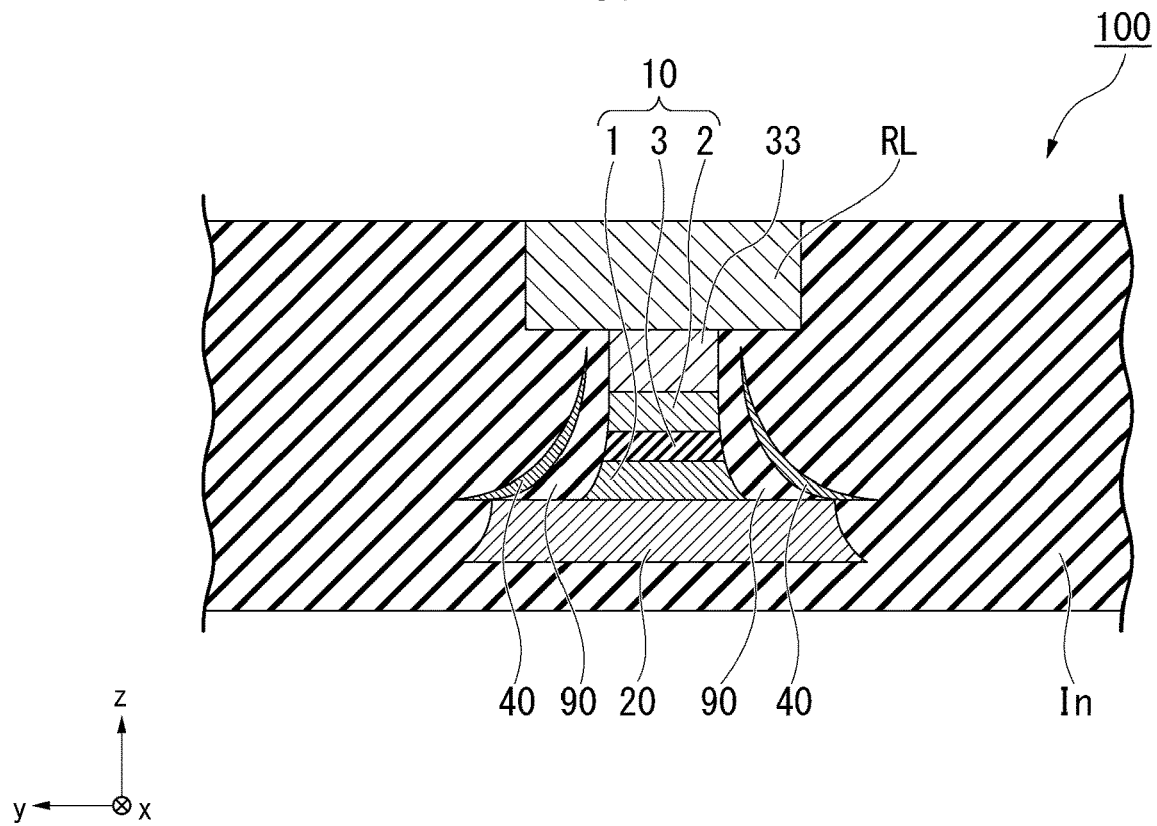
FIG. 4 is an enlarged cross-sectional view of the vicinity of the magnetoresistance effect element of the magnetic device according to the first embodiment.
Figure 5:
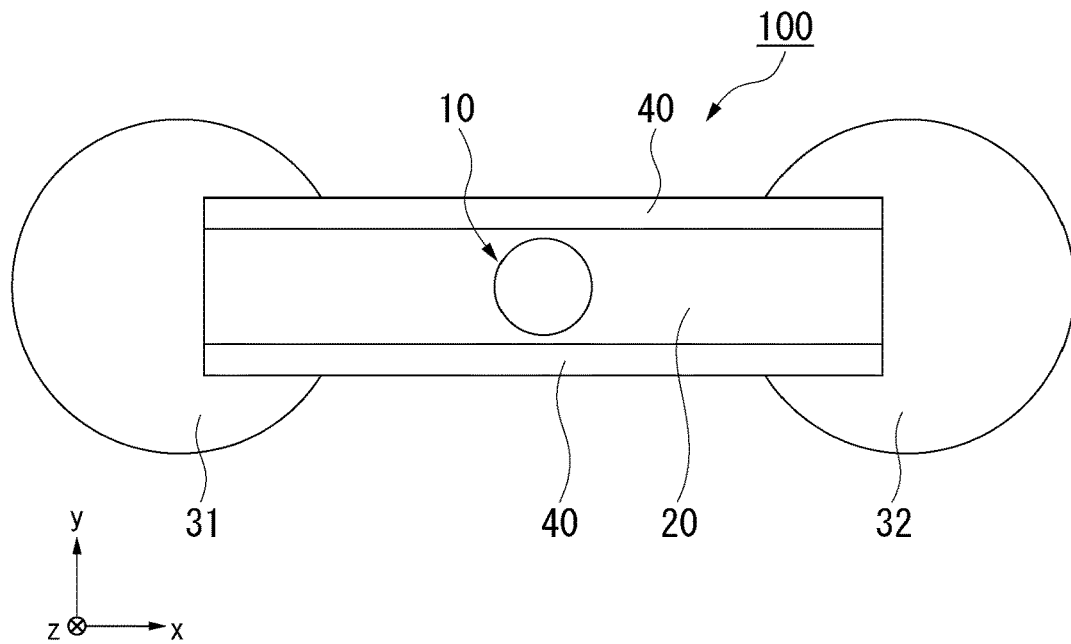
FIG. 5 is an enlarged plan view of the vicinity of the magnetoresistance effect element of the magnetic device according to the first embodiment.

FIGS. 3 and 4 are cross-sectional views of the magnetic device 200 according to the first embodiment. FIG. 3 is a cross section of the magnetoresistance effect element 100 taken along the xz plane passing through the center of the width of the spin-orbit torque wiring 20 in the y direction. FIG. 4 is a cross section of the magnetoresistance effect element 100 taken along the yz plane passing through the center of the width of the stacked body 10 in the x direction. FIG. 5 is a plan view of the magnetoresistance effect element 100 as viewed from the z direction.

The magnetoresistance effect element 100 is equipped with, for example, the stacked body 10 and the spin-orbit torque wiring 20. The resistance value of the stacked body 10 in the z direction changes as spin is injected into the stacked body 10 from the spin-orbit torque wiring 20. The magnetoresistance effect element 100 is a magnetoresistance effect element that utilizes a spin orbit torque (SOT) and may be referred to as a spin orbit torque type magnetoresistance effect element, a spin injection type magnetoresistance effect element, or a spin current magnetoresistance effect element.

The magnetoresistance effect element 100 is a three-terminal type element to which three electrodes 31, 32, and 33 are connected. The electrodes 31, 32, and 33 are made of a conductive material. The electrodes 31, 32, and 33 include any selected from the group consisting of, for example, Al, Cu, Ta, Ti, Zr, NiCr, and nitrides (e.g., TiN, TaN, and SiN). The electrode 33 may also serve as a hard mask used in the manufacturing process of the magnetoresistance effect element 100. The electrode 33 may be made of, for example, a transparent electrode material.

The electrode 31 and the electrode 32 are connected to the spin-orbit torque wiring 20 at a position where the stacked body 10 is sandwiched in the x direction in a plan view from the z direction. The electrode 33 is connected to the stacked body 10. The stacked body 10 is connected to the reading line RL via the electrode 33. The reading line RL extends in the x direction.

A radiator 40 is in the vicinity of the magnetoresistance effect element 100. The radiator 40 is located outside a first insulating layer 90 that covers the side surface of the stacked body 10 with the stacked body 10 as a reference. The first insulating layer 90 is located between the stacked body 10 and the radiator 40 and is part of the insulator In.

The radiator 40 is, for example, a layer extending in the x direction. There are two radiators 40 shown in FIG. 4, and the two radiators 40 sandwich the stacked body 10 in the y direction.

The radiator 40 is in the vicinity of the side surface of the stacked body 10, and the shortest distance between the stacked body 10 and the radiator 40 in the x direction differs depending on the position in the z direction. Since the distance between the stacked body 10 and the radiator 40 in the x direction differs depending on the position in the z direction, it is possible to prevent the side surface of the stacked body 10 and the radiator 40 from coming into contact with each other on the surface, and prevent a short circuit of the stacked body 10.

The radiator 40 is inclined with respect to the z direction. The radiator 40 is inclined toward the stacked body 10, and for example, an upper end thereof is closer to a stacked body 10 than a lower end. An inclination direction of the radiator 40 with respect to the z direction is, for example, the same as the inclination direction of the adjacent side surfaces of the stacked body 10 with respect to the z direction.

The thickness of the radiator 40 is narrower than the width of the stacked body 10. The thickness of the radiator 40 is an average value of a thickness of the radiator 40 in a direction orthogonal to a tangential plane of the radiator 40, and the average value is an average of the thicknesses at five different points in the z direction. The width of the stacked body 10 is, for example, a width of the stacked body 10 in the x direction or the y direction, and may be a diameter.

When the thickness of the radiator 40 is thin, a ratio occupied by the radiator 40 with respect to the whole decreases, and an integration property of the entire magnetic device 200 is improved. For example, the thickness of the radiator 40 is thicker at the lower end than at the upper end. When the film thickness of the radiator 40 is thick in a portion close to the spin-orbit torque wiring 20 that tends to generate heat at the time of the writing operation, heat can be efficiently dissipated.

The height of the radiator 40 in the z direction is, for example, higher than that of the stacked body 10. When the height of the radiator 40 is higher than that of the stacked body 10, heat can be efficiently dissipated from any position of the stacked body 10 in the z direction.

The radiator 40 has better thermal conductivity than the first insulating layer 90. The radiator 40 includes, for example, metal. The radiator 40 includes, for example, any of copper, cobalt, tungsten, tantalum, ruthenium, and aluminum. The radiator 40 is, for example, a non-magnetic material. If the radiator 40 is a non-magnetic material, it is possible to prevent the leakage magnetic field from being applied from the radiator 40 to the stacked body 10.

The radiator 40 preferably contains, for example, fine particles having an average particle size of 10 nm or less, and preferably contains fine particles having an average particle size of 5 nm or less. A contact resistance occurs at a contact interface of different particles. Since the radiator 40 contains the fine particles, the resistance increases, while ensuring the thermal conductivity. When the resistance of the radiator 40 increases, an occurrence of a short circuit via the radiator 40 is suppressed.

The radiator 40 is in contact with, for example, the spin-orbit torque wiring 20. The spin-orbit torque wiring 20 is a portion through which a write current flows, and tends to generate heat. By dissipating heat from the spin-orbit torque wiring 20 via the radiator 40, a breaking or the like of the spin-orbit torque wiring 20 can be suppressed. Further, since the radiator 40 is located in the vicinity of the first ferromagnetic layer 1 whose magnetization is inverted, it is possible to suppress the deterioration of the magnetization stability of the first ferromagnetic layer 1.

The stacked body 10 is sandwiched between the spin-orbit torque wiring 20 and the electrode 33 in the z direction. The stacked body 10 is a columnar body. A shape of the stacked body 10 from the z direction when viewed in a plan view is, for example, a circle, an ellipse, or a quadrangle. The side surface of the stacked body 10 is, for example, inclined with respect to the z direction.

The stacked body 10 has, for example, a first ferromagnetic layer 1, a second ferromagnetic layer 2, and a non-magnetic layer 3. The first ferromagnetic layer 1 is in contact with, for example, the spin-orbit torque wiring 20 and is stacked on the spin-orbit torque wiring 20. Spin is injected into the first ferromagnetic layer 1 from the spin-orbit torque wiring 20. The magnetization of the first ferromagnetic layer 1 receives spin-orbit torque (SOT) due to the injected spin, and an orientation direction thereof changes. The first ferromagnetic layer 1 and the second ferromagnetic layer 2 sandwich the non-magnetic layer 3 in the z direction.

The first ferromagnetic layer 1 and the second ferromagnetic layer 2 each have magnetization. The magnetization of the second ferromagnetic layer 2 is less likely to change in the orientation direction than the magnetization of the first ferromagnetic layer 1 when a predetermined external force is applied. The first ferromagnetic layer 1 is called a magnetization free layer, and the second ferromagnetic layer 2 is sometimes called a magnetization fixed layer or a magnetization reference layer. A resistance value of the stacked body 10 changes depending on a difference in relative angles of magnetization between the first ferromagnetic layer 1 and the second ferromagnetic layer 2 sandwiching the non-magnetic layer 3.

The first ferromagnetic layer 1 and the second ferromagnetic layer 2 include a ferromagnetic material. The ferromagnetic material is, for example, a metal selected from a group consisting of Cr, Mn, Co, Fe and Ni, an alloy containing at least one of these metals, and an alloy containing at least one or more elements of these metals and B, C, and N. The ferromagnetic material is, for example, Co—Fe, Co—Fe—B, Ni—Fe, Co—Ho alloy, Sm—Fe alloy, Fe—Pt alloy, Co—Pt alloy, and CoCrPt alloy.

The first ferromagnetic layer 1 and the second ferromagnetic layer 2 may contain a Heusler alloy. The Heusler alloy includes intermetallic compounds with a chemical composition of XYZ or $X_2YZ$. X is a transition metal element or a noble metal element of Group Co, Fe, Ni, or Cu on the periodic table, Y is a transition metal of Group Mn, V, Cr or Ti, or an elemental species of X, and Z is a typical element of group III to Group V. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ and the like. The Heusler alloy have a high spin polarizability.

The non-magnetic layer 3 contains a non-magnetic material. When the non-magnetic layer 3 is an insulator (when it is a tunnel barrier layer), for example, $Al_2O_3$, $SiO_2$, MgO, $MgAl_2O_4$ and the like can be used as the material thereof. In addition to these, it is also possible to use a material in which part of Al, Si, and Mg is replaced with Zn, Be, and the like. Among them, since MgO and $MgAl_2O_4$ are materials that can realize a coherent tunnel, spin can be efficiently injected. When the non-magnetic layer 3 is a metal, Cu, Au, Ag or the like can be used as the material. Further, when the non-magnetic layer 3 is a semiconductor, Si, Ge, $CuInSe_2$, $CuGaSe_2$, Cu(In, Ga) See and the like can be used as the material thereof.

The stacked body 10 may have layers other than the first ferromagnetic layer 1, the second ferromagnetic layer 2, and the non-magnetic layer 3. For example, a base layer may be provided between the spin-orbit torque wiring 20 and the first ferromagnetic layer 1. The base layer enhances the crystallinity of each layer constituting the stacked body 10. Further, for example, a cap layer may be provided on the uppermost surface of the stacked body 10.

Further, the stacked body 10 may be provided with a ferromagnetic layer on the surface of the second ferromagnetic layer 2 opposite to the non-magnetic layer 3 via a spacer layer. The second ferromagnetic layer 2, the spacer layer, and the ferromagnetic layer have a synthetic antiferromagnetic structure (SAF structure). The synthetic antiferromagnetic structure consists of two magnetic layers sandwiching the non-magnetic layer. The antiferromagnetic coupling between the second ferromagnetic layer 2 and the ferromagnetic layer increases the coercive force of the second ferromagnetic layer 2 as compared with a case of having no ferromagnetic layer. The ferromagnetic layer is, for example, IrMn, PtMn, or the like. The spacer layer contains, for example, at least one selected from the group consisting of Ru, Ir, and Rh.

The spin-orbit torque wiring 20 extends, for example, in the x direction. The write current flows along the spin-orbit torque wiring 20. At least part of the spin-orbit torque wiring 20 sandwiches the first ferromagnetic layer 1 together with the non-magnetic layer 3 in the z direction.

The spin-orbit torque wiring 20 generates a spin current by a spin Hall effect when the current I flows, and injects spin into the first ferromagnetic layer 1. The spin-orbit torque wiring 20 applies, for example, spin-orbit torque (SOT) sufficient to reverse the magnetization of the first ferromagnetic layer 1 to the magnetization of the first ferromagnetic layer 1. The spin Hall effect is a phenomenon in which a spin current is induced in a direction orthogonal to the direction in which a current flows, on the basis of the spin-orbit interaction when a current flows. The spin Hall effect is common to a normal Hall effect in that a motion (moving) charge (electron) bend a motion (moving) direction. In the normal Hall effect, the motion direction of a charged particle moving in a magnetic field is bent by a Lorentz force. On the other hand, in the spin Hall effect, even in the absence of a magnetic field, the movement direction of spin is bent only by the movement of electrons (only the flow of current).

For example, when a current flows through the spin-orbit torque wiring 20, a first spin oriented in one direction and a second spin oriented in a direction opposite to the first spin are each bent by a spin hole effect in the direction orthogonal to the direction in which the current flows. For example, the first spin oriented in a −y direction is bent in a +z direction, and the second spin oriented in a +y direction is bent in a −z direction.

In a non-magnetic material (a material that is not a ferromagnetic material), the number of electrons of the first spin and the number of electrons of the second spin generated by the spin Hall effect are equal. That is, the number of electrons of the first spin oriented in the +z direction is equal to the number of electrons of the second spin oriented in the −z direction. The first spin and the second spin current in a direction of eliminating the uneven distribution of spins. In the movement of the first spin and the second spin in the z direction, because the flows of charge cancel each other out, the amount of current becomes zero. A spin current without the current is particularly called a pure spin current.

When flow of the electron of the first spin is expressed by $J_\uparrow$, the electron flow of the second spin is expressed by $J_\downarrow$, and the spin current is expressed by $J_S$, they are defined as $J_S = J_\uparrow - J_\downarrow$. The spin current $J_S$ occurs in the z direction. The first spin is injected into the first ferromagnetic layer 1 from the spin-orbit torque wiring 20.

The spin-orbit torque wiring 20 contains any one of metal, alloy, intermetallic compound, metal boride, metal carbide, metal silicide, and metal phosphide having a function of generating a spin current by the spin Hall effect when the current I flows.

The spin-orbit torque wiring 20 contains, for example, a non-magnetic heavy metal as a main component. The heavy metal means a metal having a specific gravity of yttrium (Y) or more. The non-magnetic heavy metal is, for example, a non-magnetic metal having a d-electron or an f-electron in the outermost shell and having a large atomic number of 39 or more. The spin-orbit torque wiring 20 is made up of, for example, Hf, Ta, and W. Non-magnetic heavy metals have stronger spin-orbit interaction than other metals. The spin-hole effect is generated by the spin-orbit interaction, and spins are likely to be unevenly distributed in the spin-orbit torque wiring 20, and spin current $J_S$ is likely to occur.

The spin-orbit torque wiring 20 may also contain a magnetic metal. The magnetic metal is a ferromagnetic metal or an antiferromagnetic metal. A small amount of magnetic metal contained in the non-magnetic material becomes a spin scattering factor. The small amount is, for example, 3% or less of a total molar ratio of the elements constituting the spin-orbit torque wiring 20. When the spins are scattered by the magnetic metal, the spin-orbit interaction is enhanced, and the generation efficiency of spin current with respect to the current is increased.

The spin-orbit torque wiring 20 may include a topological insulator. The topological insulator is a substance in which the inside of the substance is an insulator or a high resistor, but a metallic state in which spin polarization occurs on the surface thereof. In the topological insulator, an internal magnetic field is generated by the spin-orbit interaction. The topological insulator develops a new topological phase due to the effect of spin-orbit interaction even in the absence of an external magnetic field. The topological insulator can generate pure spin currents with high efficiency due to strong spin-orbit interaction and breaking of inversion symmetry at the edges. The topological insulator is, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$ and the like. The topological insulator can generate spin currents with high efficiency.

Next, a method of manufacturing the magnetic device 200 will be described. The magnetic device 200 is formed by a stacking process of each layer, and a processing process of processing part of each layer into a predetermined shape. Each layer can be stacked, using a sputtering method, a chemical vapor deposition (CVD) method, an electron beam vapor deposition method (EB vapor deposition method), an atomic laser deposit method, or the like. Each layer can be processed, using photolithography or the like.

Hereinafter, a method for manufacturing the vicinity of the magnetoresistance effect element 100 will be described. First, a conductive film is formed on the insulating layer and the electrodes 31 and 32 and processed into a predetermined shape to form the spin-orbit torque wiring 20. Further, the periphery of the spin-orbit torque wiring 20 is filled with an insulating layer.

Next, an upper surface of the spin-orbit torque wiring 20 is exposed by chemical mechanical polishing (CMP). Next, the magnetic layer, the non-magnetic layer, and the magnetic layer are stacked sequentially on the spin-orbit torque wiring 20 and the insulating layer. Further, a hard mask is formed at a predetermined position on the magnetic layer.

Next, the magnetic layer, the non-magnetic layer, and the magnetic layer are processed via a hard mask. Each of the magnetic layers becomes the first ferromagnetic layer 1 and the second ferromagnetic layer, the non-magnetic layer becomes the non-magnetic layer 3, and the stacked body 10 is formed. The hard mask becomes, for example, part of the electrode 33. The first insulating layer 90 is formed so as to cover the stacked body 10 and the electrode 33. Next, a conductive layer and an insulating layer are formed to cover the first insulating layer 90.

Next, some parts of the first insulating layer 90, the conductive layer, and the insulating layer are removed by chemical mechanical polishing (CMP) to expose the electrode 33. The conductive layer on the first insulating layer 90 becomes the radiator 40. A reading line RL is formed on the electrode 33 and the insulating layer. The magnetoresistance effect element 100 shown in FIGS. 3 to 5 can be obtained by the above procedure.

The magnetic device 200 according to the first embodiment has a radiator 40 on the outside of the stacked body 10. The radiator 40 has better heat radiating properties than the first insulating layer 90, and radiates heat from the vicinity of the magnetoresistance effect element 100. By radiating heat from the vicinity of the magnetoresistance effect element 100, the magnetization stability of the first ferromagnetic layer 1 and the second ferromagnetic layer 2 is improved. Further, it is possible to suppress the accumulation of heat in the spin-orbit torque wiring 20 which tends to generate heat when writing, and prevent disconnection or the like of the spin-orbit torque wiring 20.

First Modified Example

Figure 6:
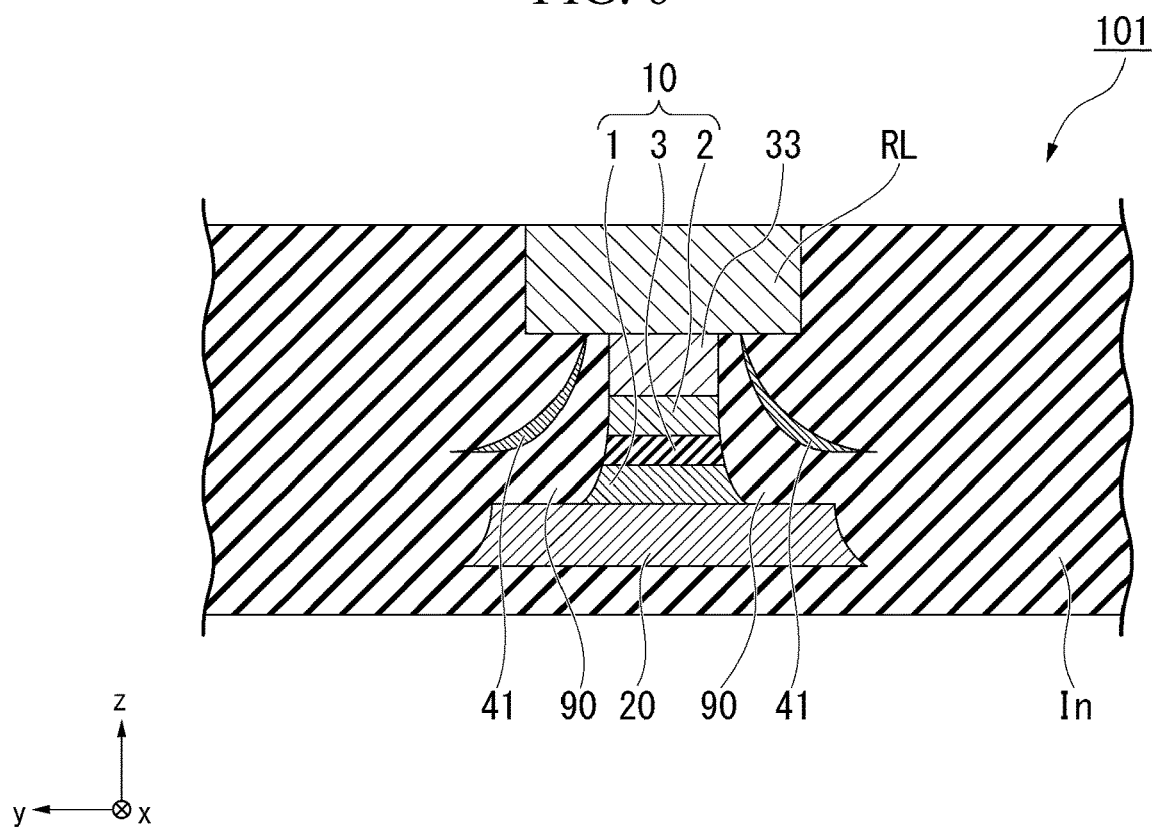
FIG. 6 is an enlarged cross-sectional view of the vicinity of the magnetoresistance effect element of the magnetic device according to a first modified example.

FIG. 6 is an enlarged cross-sectional view of the vicinity of a magnetoresistance effect element 101 of the magnetic device according to the first modified example. In FIG. 6, the same components as those of FIG. 4 are designated by the same reference numerals, and the description thereof will not be provided.

A radiator 41 is provided in the vicinity of the magnetoresistance effect element 101. The radiator 41 is different from the radiator 40 according to the first embodiment in that the radiator 41 is in contact with the reading line RL rather than the spin-orbit torque wiring 20.

The electrodes 31, 32, and 33 are in contact with the reading line RL or a via wiring V having a large heat capacity. Therefore, most of the heat generated by the magnetoresistance effect element 101 escapes via the electrodes 31, 32, and 33. When the radiator 40 comes into contact with the reading line RL, the heat collected in the radiator 40 can be efficiently dissipated from the radiator 40 to the reading line RL.

The magnetoresistance effect element 101 according to the first modified example can efficiently dissipate the generated heat, as in the magnetoresistance effect element 100 according to the first embodiment.

Second Modified Example

Figure 7:
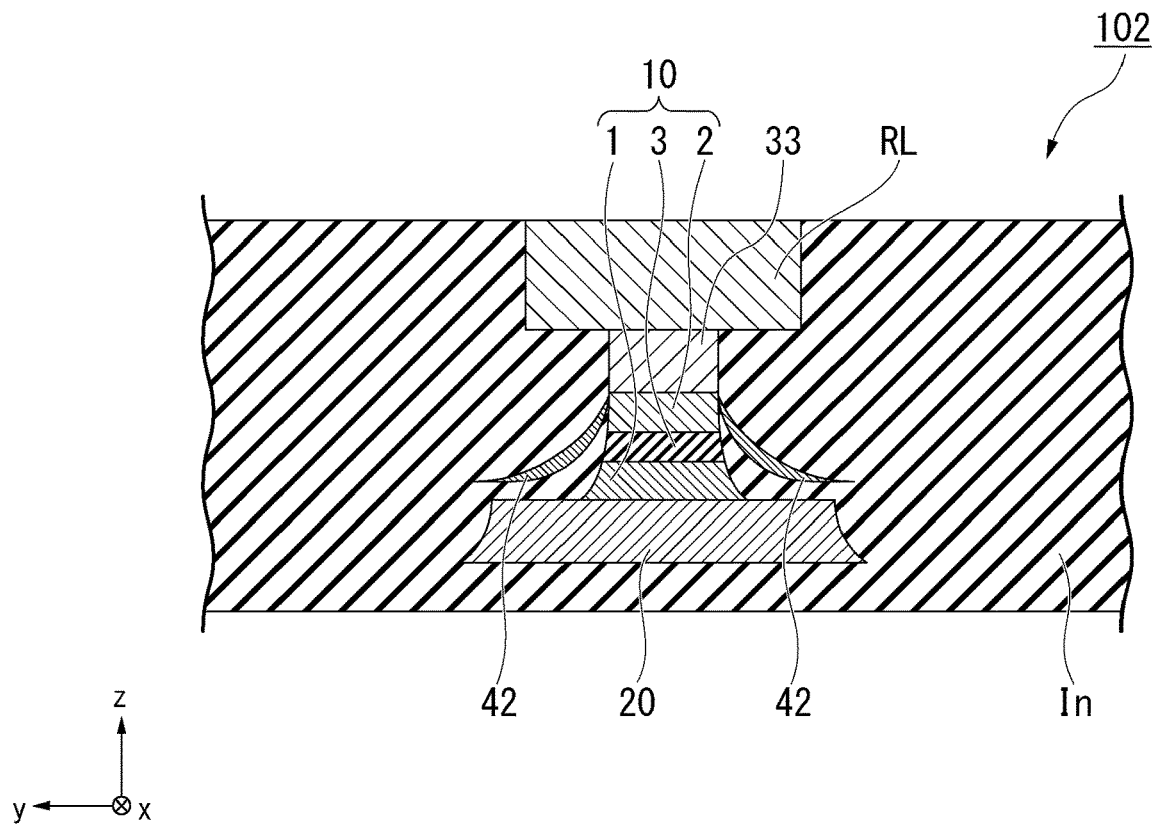
FIG. 7 is an enlarged cross-sectional view of the vicinity of the magnetoresistance effect element of the magnetic device according to a second modified example.

FIG. 7 is an enlarged cross-sectional view of the vicinity of a magnetoresistance effect element 102 of the magnetic device according to the second modified example. In FIG. 7, the same components as those of FIG. 4 are designated by the same reference numerals, and the description thereof will not be provided.

A radiator 42 is provided in the vicinity of the magnetoresistance effect element 102. The radiator 42 is different from the radiator 40 according to the first embodiment in that the radiator 42 is in contact with the stacked body 10 rather than the spin-orbit torque wiring 20. The radiator 42 is in contact with either one of the first ferromagnetic layer 1 and the second ferromagnetic layer 2 of the stacked body 10. When the radiator 42 is in contact with only one of the first ferromagnetic layer 1 and the second ferromagnetic layer 2, a short circuit via the radiator 42 can be prevented.

The magnetoresistance effect element 102 according to the second modified example can efficiently dissipate the generated heat, as in the magnetoresistance effect element 100 according to the first embodiment.

Third Modified Example

Figure 8:
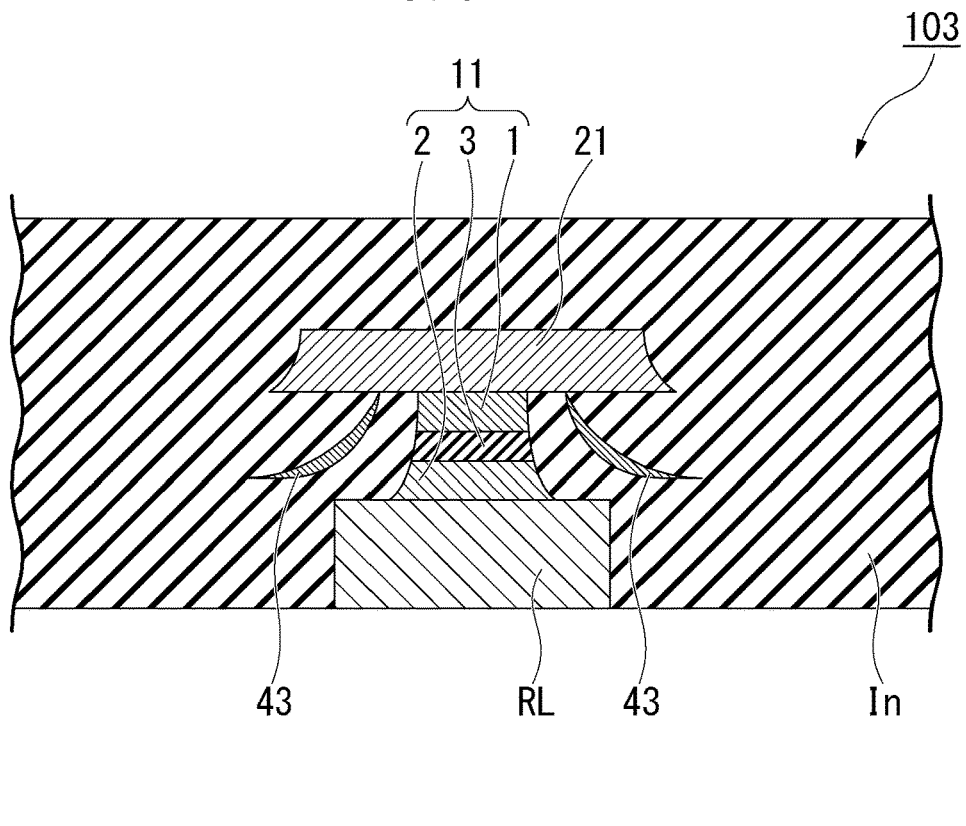
FIG. 8 is an enlarged cross-sectional view of the vicinity of the magnetoresistance effect element of the magnetic device according to a third modified example.

FIG. 8 is an enlarged cross-sectional view of the vicinity of a magnetoresistance effect element 103 of the magnetic device according to the third modified example. In FIG. 8, the same components as those of FIG. 4 are designated by the same reference numerals, and the description thereof will not be provided.

The magnetoresistance effect element 103 differs from the magnetoresistance effect element 100 according to the first embodiment in the stacking order of each layer. The second ferromagnetic layer 2 is closer to a substrate Sub than the first ferromagnetic layer 1 whose magnetization direction changes. Such a magnetoresistance effect element 103 is called a bottom pin structure. The spin-orbit torque wiring 21 is formed on the stacked body 10.

The radiator 43 extends in the x direction and sandwiches the stacked body 10 in the y direction. A distance between the radiator 43 and the stacked body 11 differs depending on the position in the z direction. The distance between the radiator 43 and the first ferromagnetic layer 1 is shorter than the distance between the radiator 43 and the second ferromagnetic layer 2. The magnetization stability of the first ferromagnetic layer 1 is lower than the magnetization stability of the second ferromagnetic layer 2. Since the radiator 43 exists near the first ferromagnetic layer 1 having low magnetization stability, the magnetic stability of the magnetoresistance effect element 103 is improved. Since the magnetoresistance effect element 103 stores data depending on the direction of magnetization of the first ferromagnetic layer 1, improvement of the magnetization stability of the first ferromagnetic layer 1 leads to improvement of data reliability.

The magnetoresistance effect element 103 according to the third modified example can efficiently dissipate the generated heat, as in the magnetoresistance effect element 100 according to the first embodiment.

Fourth Modified Example

Figure 9:
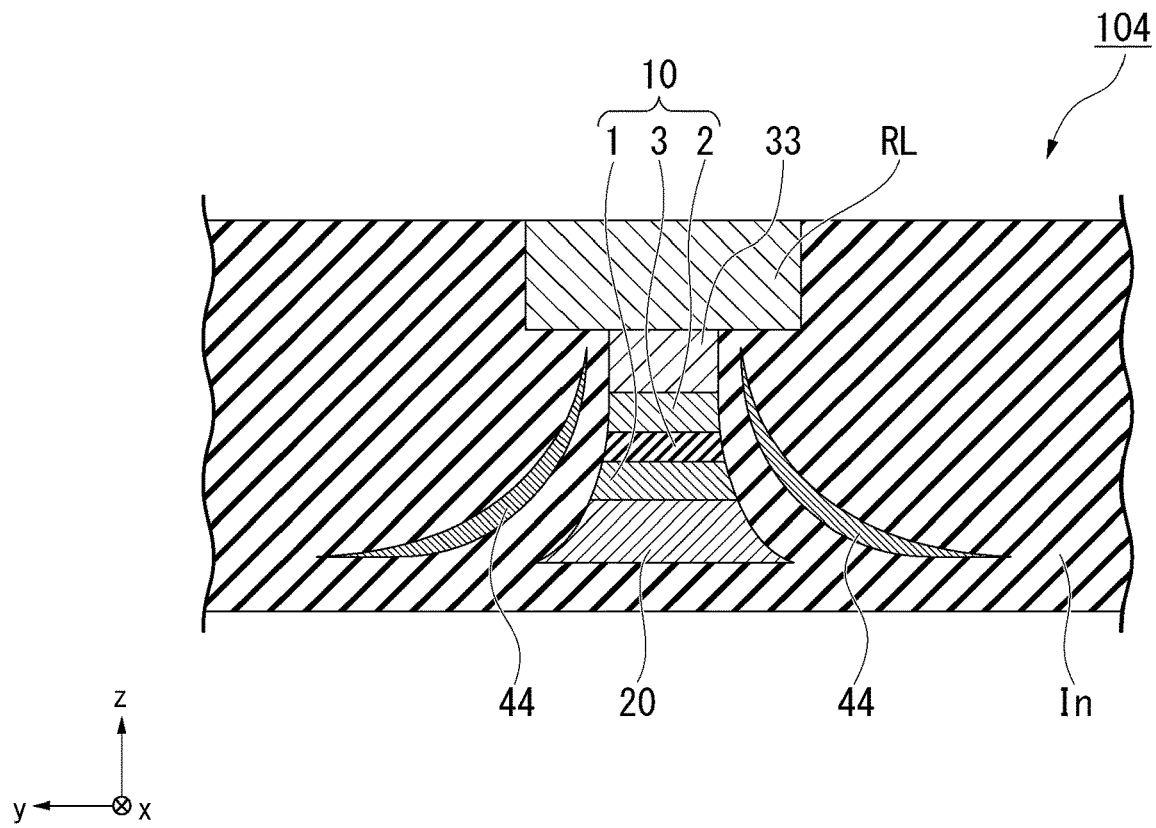
FIG. 9 is an enlarged cross-sectional view of the vicinity of the magnetoresistance effect element of the magnetic device according to a fourth modified example.

FIG. 9 is an enlarged cross-sectional view of the vicinity of a magnetoresistance effect element 104 of the magnetic device according to the fourth modified example. In FIG. 9, the same components as those of FIG. 4 are designated by the same reference numerals, and the description thereof will not be provided.

In the magnetoresistance effect element 104, the side surfaces of the stacked body 10 and the spin-orbit torque wiring 20 in the y direction are continuous. The structure is obtained by simultaneously processing the shapes of the stacked body 10 and the spin-orbit torque wiring 20 in the y direction.

A radiator 44 is provided in the vicinity of the magnetoresistance effect element 104. A height of the radiator 44 in the z direction is higher than, for example, a total height of the spin-orbit torque wiring 20 and the stacked body 10.

The magnetoresistance effect element 104 according to the fourth modified example can efficiently dissipate the generated heat, as in the magnetoresistance effect element 100 according to the first embodiment.

Fifth Modified Example

Figure 10:
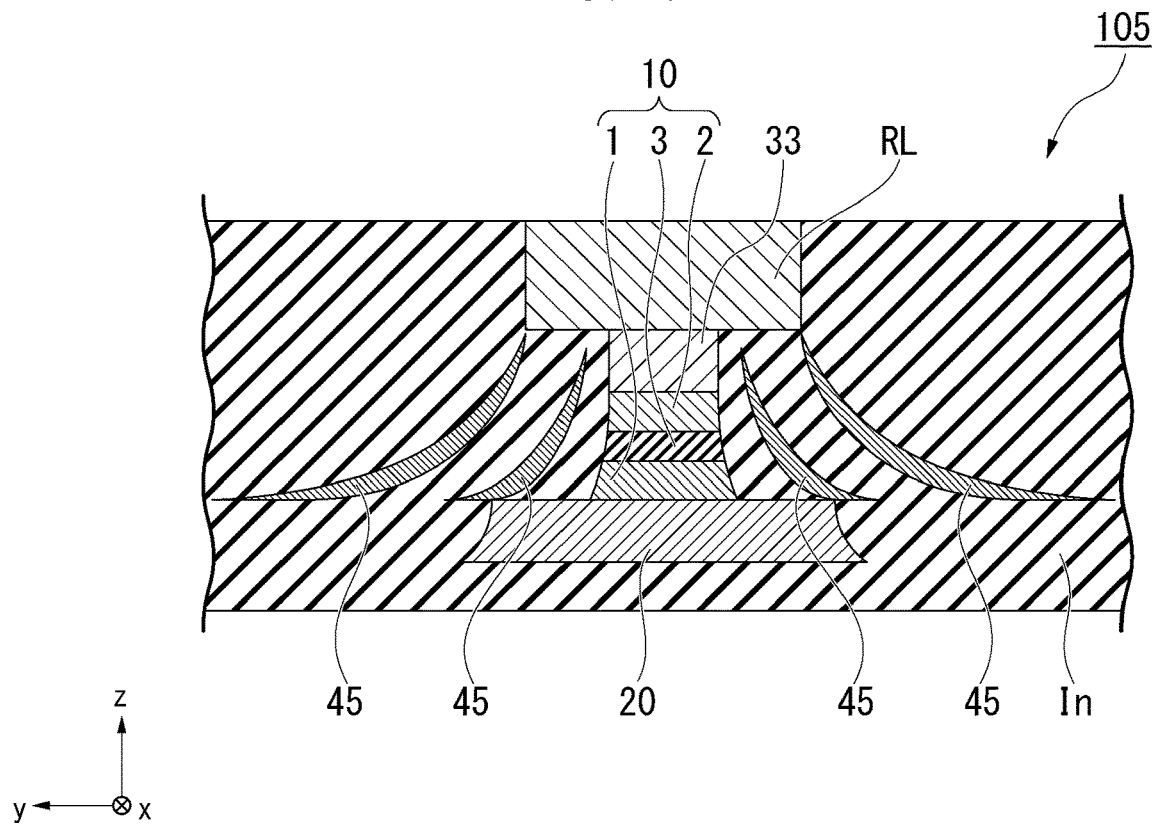
FIG. 10 is an enlarged cross-sectional view of the vicinity of the magnetoresistance effect element of the magnetic device according to a fifth modified example.

FIG. 10 is an enlarged cross-sectional view of the vicinity of a magnetoresistance effect element 105 of the magnetic device according to the fifth modified example. In FIG. 10, the same components as those of FIG. 4 are designated by the same reference numerals, and the description thereof will not be provided.

A plurality of radiators 45 are provided in the vicinity of the magnetoresistance effect element 105. A plurality of radiators 45 are provided toward the outside with respect to the stacked body 10. The insulating layer and the radiator 45 alternately cover the side surfaces of the stacked body 10.

The magnetoresistance effect element 105 according to the fifth modified example can efficiently dissipate the generated heat, as in the magnetoresistance effect element 100 according to the first embodiment. Further, since the number of radiators 45 is large, the magnetoresistance effect element 105 is exceptional in heat radiating properties.

Sixth Modified Example

Figure 11:
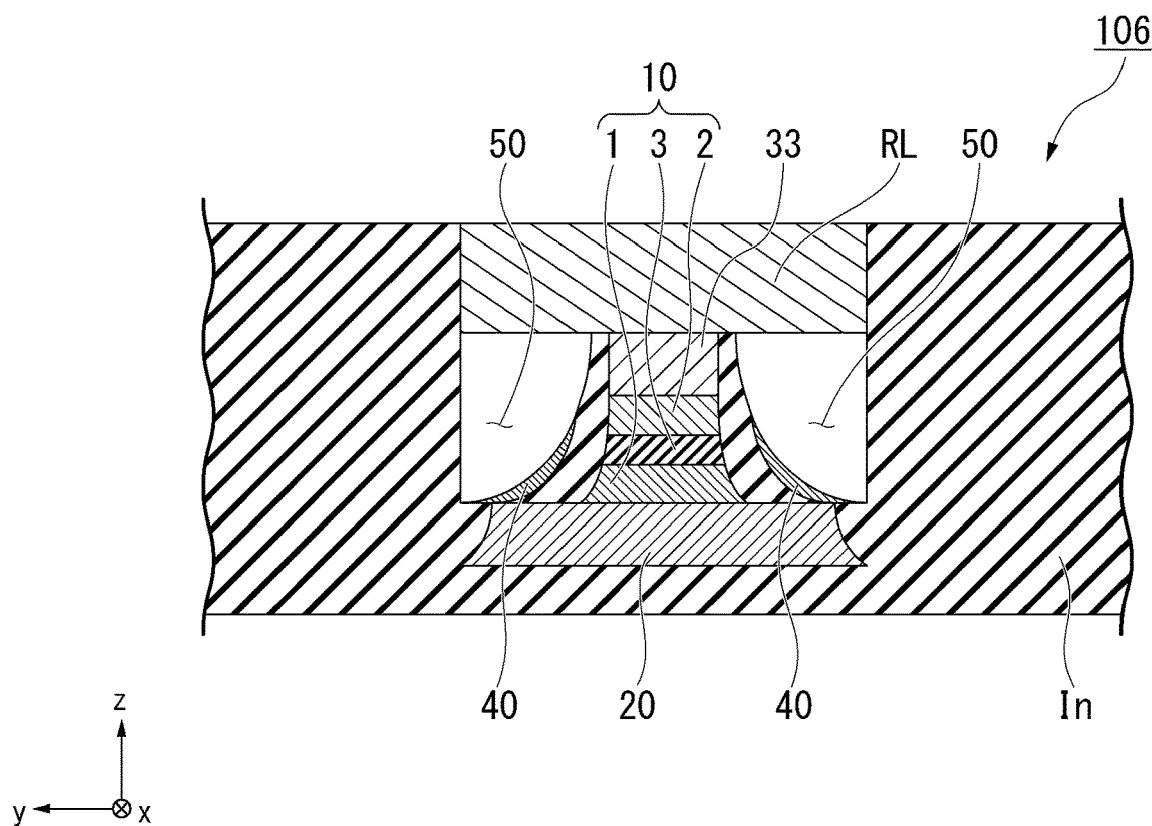
FIG. 11 is an enlarged cross-sectional view of the vicinity of the magnetoresistance effect element of the magnetic device according to a sixth modified example.

FIG. 11 is an enlarged cross-sectional view of the vicinity of a magnetoresistance effect element 106 of the magnetic device according to the sixth modified example. In FIG. 11, the same components as those of FIG. 4 are designated by the same reference numerals, and the description thereof will not be provided.

The magnetoresistance effect element 106 has a space 50. The space 50 is located outside the radiator 40 with respect to the stacked body 10. The space 50 is in contact with, for example, the radiator 40. That is, part of the radiator 40 is exposed to the space 50. The space 50 is, for example, located below the reading line RL. The space 50 is obtained by forming a resist on the radiator 40, forming the reading line RL, and then removing the resist. The inside of the space 50 is a vacuum or an atmosphere, and has exceptional heat insulating properties.

As in the magnetoresistance effect element 100 according to the first embodiment, the magnetoresistance effect element 106 according to the sixth modified example can suppress the heat from being transferred to the surrounding elements, while efficiently dissipating the generated heat.

The space 50 suppresses heat conduction from the radiator 40 to the surroundings. Therefore, the heat generated by the magnetoresistance effect element 106 reaches the radiator 40 and then goes in the z direction. That is, the magnetoresistance effect element 106 according to the sixth modified example can control the flow of heat.

Seventh Modified Example

Figure 12:
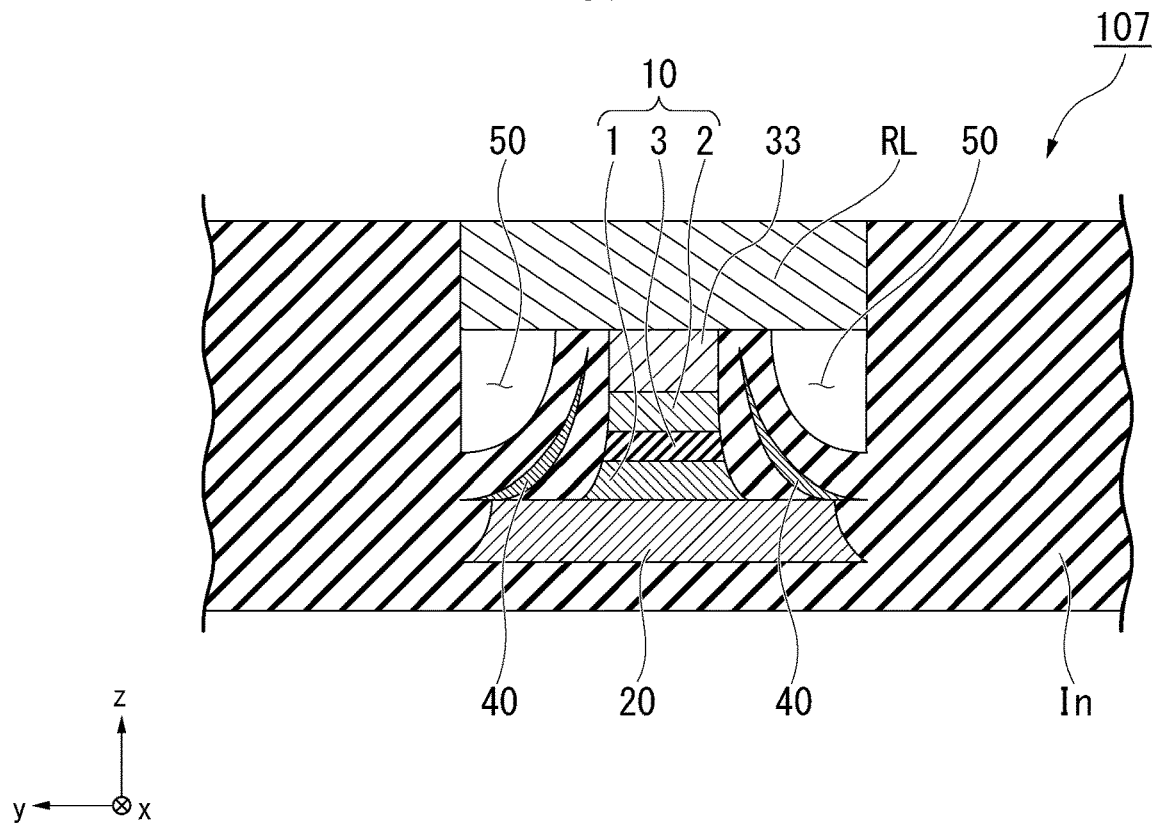
FIG. 12 is an enlarged cross-sectional view of the vicinity of the magnetoresistance effect element of the magnetic device according to a seventh modified example.

FIG. 12 is an enlarged cross-sectional view of the vicinity of a magnetoresistance effect element 107 of the magnetic device according to the seventh modified example. In FIG.

12, the same components as those of FIG. 11 are designated by the same reference numerals, and the description thereof will not be provided.

The magnetoresistance effect element 107 has a space 51. The space 51 is located outside the radiator 40 with respect to the stacked body 10. The space 51 is different from the sixth modified example in that it is not in contact with the radiator 40.

The magnetoresistance effect element 107 according to the seventh modified example has the same effect as that of the sixth modified example. Further, by covering the radiator 40 with the insulator In, it is possible to prevent the radiator 40 from being unintentionally peeled off.

Second Embodiment

Figure 13:
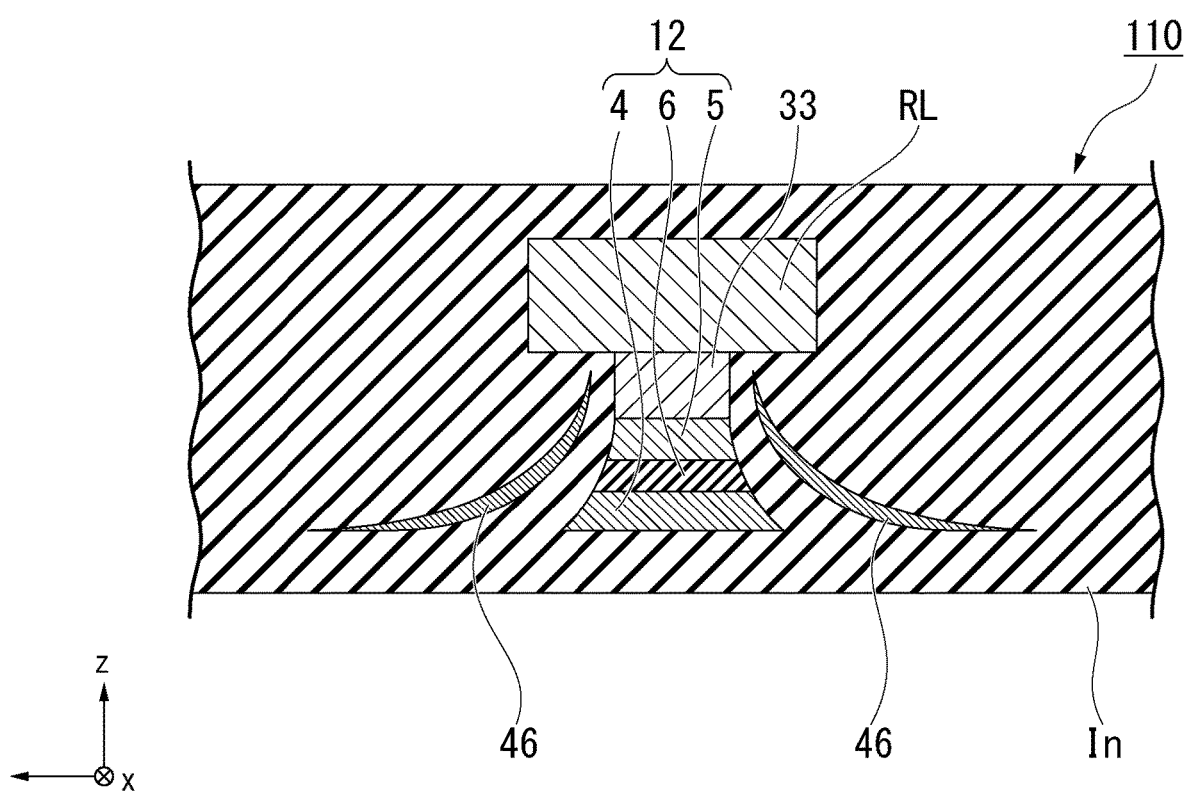
FIG. 13 is an enlarged plan view of the vicinity of the magnetoresistance effect element of the magnetic device according to a second embodiment.

FIG. 13 is an enlarged cross-sectional view of the vicinity of a magnetoresistance effect element 110 of the magnetic device according to the second embodiment. In FIG. 13, the configuration of the magnetoresistance effect element 110 is different from that of FIG. 4.

The magnetoresistance effect element 110 according to the second embodiment is made of a stacked body 12. The stacked body 12 includes a first ferromagnetic layer 4, a second ferromagnetic layer 5, and a non-magnetic layer 6. The non-magnetic layer 6 is located between the first ferromagnetic layer 4 and the second ferromagnetic layer 5.

The first ferromagnetic layer 4 has a domain wall DW. A resistance value of the magnetoresistance effect element 110 changes depending on the position of the domain wall DW. In some cases, the magnetoresistance effect element 110 may be referred to as a domain wall moving element.

The magnetoresistance effect element 110 is coated with the insulator In. A radiator 46 is located outside the outer surface of the stacked body 12.

The magnetic device according to the second embodiment is different in that the magnetoresistance effect element 110 is a domain wall moving type magnetoresistance effect element, and the same effect as that of the magnetic device 200 according to the first embodiment can be obtained.

Third Embodiment

Figure 14:
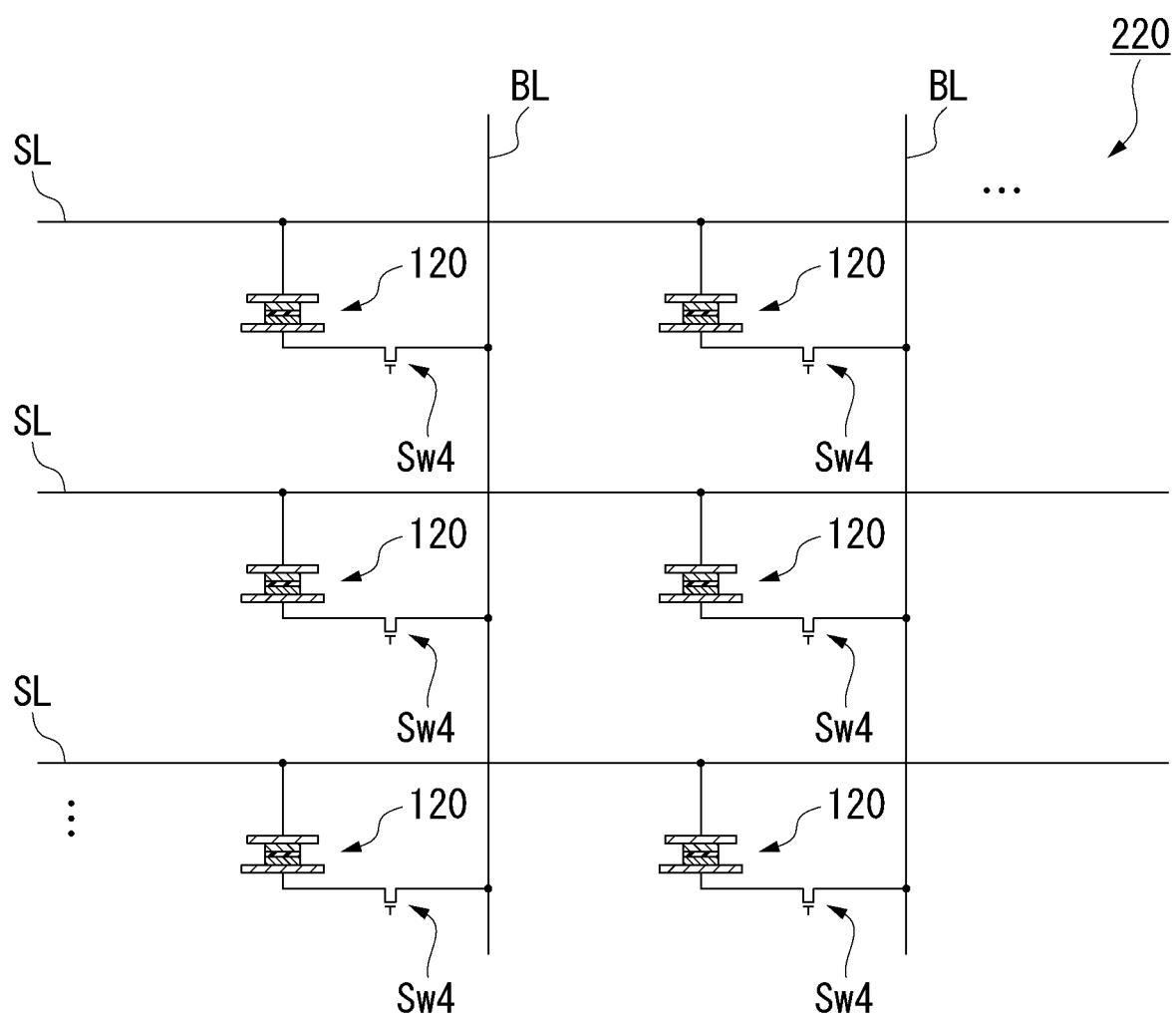
FIG. 14 is a schematic diagram of a magnetic device according to a third embodiment.

FIG. 14 is a schematic view of a magnetic device 220 according to the third embodiment. The magnetic device 220 includes a plurality of magnetoresistance effect elements 120, a plurality of source lines SL, a plurality of bit lines BL, and a plurality of fourth switching elements Sw4.

The magnetoresistance effect elements 120 are arranged, for example, in a matrix. Each of the magnetoresistance effect elements 120 is connected to the source line SL and the bit line BL.

The flow of current to the magnetoresistance effect element 120 is controlled by a fourth switching element Sw4. The magnetoresistance effect element 120 writes and reads data by turning on the fourth switching element Sw4. The magnetoresistance effect element 120 writes the data, using a spin transfer torque when a current flows in the stacking direction. The fourth switching element Sw4 is the same as the first switching element Sw1 or the like.

Figure 15:
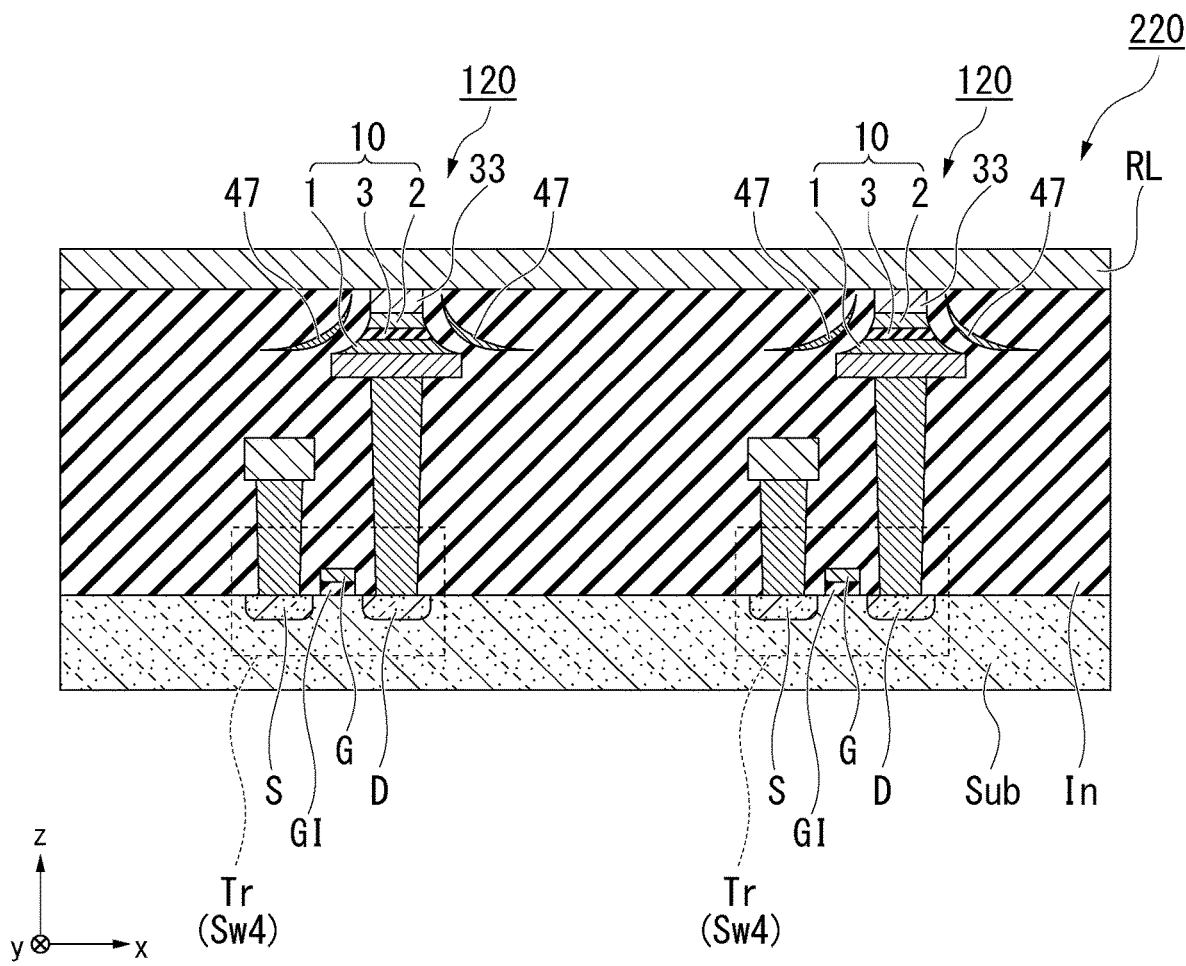
FIG. 15 is a cross-sectional view of the magnetic device according to the third embodiment.

FIG. 15 is a cross-sectional view of the magnetic device 220 according to the third embodiment. The periphery of the magnetoresistance effect element 100 and the transistor Tr is covered with an insulator In. A radiator 47 is formed inside the insulator In.

Figure 16:
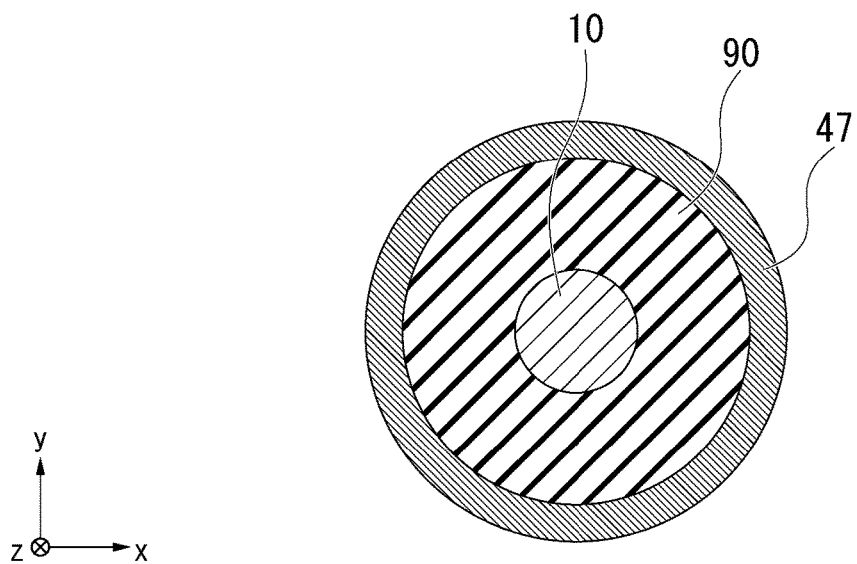
FIG. 16 is an enlarged cross-sectional view of the vicinity of the magnetoresistance effect element of the magnetic device according to the third embodiment.

FIG. 16 is an enlarged cross-sectional view of the vicinity of the magnetoresistance effect element 120 of the magnetic device 220 according to the third embodiment. FIG. 16 is a cut surface taken along the xy plane passing through the first ferromagnetic layer 1.

The radiator 47 surrounds the side surface of the stacked body 10. The radiator 47 shown in FIG. 16 surrounds the entire circumference of the stacked body 10, but may partially surround the stacked body 10. A first insulating layer 90 is provided between the radiator 47 and the stacked body 10.

The magnetic device 220 according to the third embodiment is different in that the magnetoresistance effect element is a spin transfer type magnetoresistance effect element, and the same effect as that of the magnetic device 200 according to the first embodiment can be obtained.

Although preferred embodiments of the present invention have been shown here based on the first to third embodiments, the present invention is not limited to these embodiments. For example, the characteristic configurations in each embodiment and modified example may be applied to other embodiments.

EXPLANATION OF REFERENCES 1, 4 First ferromagnetic layer
2, 5 Second ferromagnetic layer
3, 6 Non-magnetic layer
10, 11, 12 Stacked body
20, 21 spin-orbit torque wiring
31, 32, 33 Electrode
40, 41, 42, 43, 44, 45, 46, 47 Radiator
50, 51 Space
90 First insulating layer
100, 101, 102, 103, 104, 105, 106, 107, 110, 120 Magnetoresistance effect element
200, 220 Magnetic device
BL Bit line
CL Common line
In Insulator
RL Reading line
SL Source line
Sub Substrate
WL Writing line

What is claimed is:

1. A magnetic device comprising:
a stacked body including a first ferromagnetic layer, a second ferromagnetic layer, and a non-magnetic layer sandwiched between the first ferromagnetic layer and the second ferromagnetic layer;
a first insulating layer which covers a side surface of the stacked body;
a first radiator located outside the first insulating layer with respect to the stacked body;
a second radiator located outside the first insulating layer with respect to the stacked body; and
a wiring connected to the stacked body,
wherein a distance between the side surface of the stacked body and the first radiator differs depending on a position of the stacked body in a stacking direction, and a magnetization of the first ferromagnetic layer is reversed by flowing a current along the wiring,
the wiring, the first radiator and the second radiator extend along a first direction respectively, and
the wiring is sandwiched between the first radiator and the second radiator at a same height position as the wiring in a direction that intersects the first direction.

2. The magnetic device according to claim 1,
wherein the first radiator is inclined with respect to the stacking direction,
the side surface of the stacked body is inclined with respect to the stacking direction, and
an inclination direction of the side surface of the stacked body with respect to the stacking direction is same as an inclination direction of the first radiator with respect to the stacking direction.

3. The magnetic device according to claim 1, wherein the first radiator is in contact with the wiring.

4. The magnetic device according to claim 1, wherein a vacuum or gas filled space is provided outside the first radiator with respect to the stacked body.

5. The magnetic device according to claim 1, wherein the wiring contains a non-magnetic heavy metal having a d-electron or an f-electron in an outermost shell and having a large atomic number of 39 or more.

6. The magnetic device according to claim 1, wherein the wiring includes a topological insulator.

7. The magnetic device according to claim 1, further comprising:
a second stacked body including a third ferromagnetic layer, a fourth ferromagnetic layer, and a second non-magnetic layer sandwiched between the third ferromagnetic layer and the fourth ferromagnetic layer,
wherein the first radiator is sandwiched between the stacked body and the second stacked body.

8. The magnetic device according to claim 1, further comprising:
a second stacked body including a third ferromagnetic layer, a fourth ferromagnetic layer, and a second non-magnetic layer sandwiched between the third ferromagnetic layer and the fourth ferromagnetic layer,
wherein the second stacked body is in the first direction in which the wiring extends with respect to the stacked body.

9. A magnetic device comprising:
a stacked body including a first ferromagnetic layer, a second ferromagnetic layer, and a non-magnetic layer sandwiched between the first ferromagnetic layer and the second ferromagnetic layer;
a first insulating layer which covers a side surface of the stacked body;
a first radiator located outside the first insulating layer with respect to the stacked body; and
a wiring connected to the stacked body,
wherein a distance between the side surface of the stacked body and the first radiator differs depending on a position of the stacked body in a stacking direction, and
a magnetization of the first ferromagnetic layer is reversed by flowing a current along the wiring, and
a vacuum or gas filled space is provided outside the first radiator with respect to the stacked body.

10. The magnetic device according to claim 9,
wherein the first radiator is inclined with respect to the stacking direction,
the side surface of the stacked body is inclined with respect to the stacking direction, and
an inclination direction of the side surface of the stacked body with respect to the stacking direction is same as an inclination direction of the first radiator with respect to the stacking direction.

11. The magnetic device according to claim 9, wherein the first radiator surrounds the side surface of the stacked body.

12. The magnetic device according to claim 9, wherein the first radiator is in contact with the wiring.

13. The magnetic device according to claim 9, wherein the wiring contains a non-magnetic heavy metal having a d-electron or an f-electron in an outermost shell and having a large atomic number of 39 or more.

14. The magnetic device according to claim 9, wherein the wiring includes a topological insulator.

15. The magnetic device according to claim 9, further comprising:
a second stacked body including a third ferromagnetic layer, a fourth ferromagnetic layer, and a second non-magnetic layer sandwiched between the third ferromagnetic layer and the fourth ferromagnetic layer,
wherein the first radiator is sandwiched between the stacked body and the second stacked body.

16. The magnetic device according to claim 9, further comprising:
a second stacked body including a third ferromagnetic layer, a fourth ferromagnetic layer, and a second non-magnetic layer sandwiched between the third ferromagnetic layer and the fourth ferromagnetic layer,
wherein the second stacked body is in the first direction in which the wiring extends with respect to the stacked body.

* * * * *